United States Patent
Cai et al.

(10) Patent No.: US 9,570,466 B2
(45) Date of Patent: Feb. 14, 2017

(54) STRUCTURE AND METHOD TO FORM PASSIVE DEVICES IN ETSOI PROCESS FLOW

(71) Applicant: GLOBALFOUNDRIES INC., Grand Cayman (KY)

(72) Inventors: Ming Cai, Hopewell Junction, NY (US); Dechao Guo, Fishkill, NY (US); Chun-Chen Yeh, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/159,027

(22) Filed: Jan. 20, 2014

(65) Prior Publication Data

US 2014/0131802 A1    May 15, 2014

Related U.S. Application Data

(62) Division of application No. 13/251,660, filed on Oct. 3, 2011, now Pat. No. 8,648,438.

(51) Int. Cl.
  *H01L 27/12* (2006.01)
  *H01L 29/06* (2006.01)
  (Continued)

(52) U.S. Cl.
  CPC .......... *H01L 27/1203* (2013.01); *H01L 21/84* (2013.01); *H01L 27/13* (2013.01)

(58) Field of Classification Search
  CPC ................. H01L 21/84; H01L 27/1203; H01L 21/76224; H01L 29/785
  (Continued)

(56) References Cited

U.S. PATENT DOCUMENTS 3,729,662 A    4/1973  Langdon
5,554,870 A *  9/1996  Fitch ................. H01L 27/1104
                                                       257/329
(Continued)

OTHER PUBLICATIONS

B. El-Kareh, "Silicon Devices and Process Integration: Deep Submicron and Nano-Scale Technologies," Springer Science + Business Media, LLC, 2009, Chapter 6, "Analog Devices and Passive Components," pp. 369-437.

(Continued)

*Primary Examiner* — Long K Tran
*Assistant Examiner* — Thai T Vuong
(74) *Attorney, Agent, or Firm* — Michael LeStrange; Andrew M. Calderon; Roberts Mlotkowski Safran Cole & Calderon P.C.

(57) ABSTRACT

Techniques for fabricating passive devices in an extremely-thin silicon-on-insulator (ETSOI) wafer are provided. In one aspect, a method for fabricating one or more passive devices in an ETSOI wafer is provided. The method includes the following steps. The ETSOI wafer having a substrate and an ETSOI layer separated from the substrate by a buried oxide (BOX) is provided. The ETSOI layer is coated with a protective layer. At least one trench is formed that extends through the protective layer, the ETSOI layer and the BOX, and wherein a portion of the substrate is exposed within the trench. Spacers are formed lining sidewalls of the trench. Epitaxial silicon templated from the substrate is grown in the trench. The protective layer is removed from the ETSOI layer. The passive devices are formed in the epitaxial silicon.

20 Claims, 7 Drawing Sheets

(51) Int. Cl.
*H01L 21/84* (2006.01)
*H01L 29/78* (2006.01)
*H01L 27/13* (2006.01)

(58) Field of Classification Search
USPC ......... 257/529, 350; 438/151, 149, 155, 405
See application file for complete search history.

(56) References Cited

U.S. PATENT DOCUMENTS

| | | | |
|---|---|---|---|
| 5,610,083 A * | 3/1997 | Chan | H01L 27/1203 257/E27.112 |
| 5,952,695 A * | 9/1999 | Ellis-Monaghan | H01L 21/84 257/347 |
| 6,294,834 B1 | 9/2001 | Yeh et al. | |
| 6,351,023 B1 | 2/2002 | Gates et al. | |
| 6,384,452 B1 * | 5/2002 | Chittipeddi | H01L 27/115 257/314 |
| 6,586,311 B2 | 7/2003 | Wu | |
| 7,071,052 B2 | 7/2006 | Yeo et al. | |
| 7,122,421 B2 | 10/2006 | Sanchez et al. | |
| 7,166,904 B2 | 1/2007 | Gill et al. | |
| 7,485,944 B2 | 2/2009 | Kothandaraman et al. | |
| 7,560,784 B2 | 7/2009 | Cheng et al. | |
| 7,602,027 B2 | 10/2009 | Burke et al. | |
| 7,605,022 B2 | 10/2009 | Cha et al. | |
| 2001/0039088 A1 * | 11/2001 | Aoki | H01L 27/10867 438/244 |
| 2003/0104658 A1 * | 6/2003 | Furukawa et al. | 438/151 |
| 2008/0169507 A1 * | 7/2008 | Nowak | H01L 27/016 257/350 |
| 2009/0108314 A1 * | 4/2009 | Cai | H01L 21/84 257/301 |
| 2010/0059823 A1 * | 3/2010 | Chung | H01L 21/82387 257/355 |
| 2011/0002188 A1 | 1/2011 | Chen et al. | |
| 2011/0147881 A1 * | 6/2011 | Fenouillet-Beranger | H01L 21/76264 257/506 |
| 2011/0169089 A1 * | 7/2011 | Doris et al. | 257/350 |
| 2011/0175152 A1 * | 7/2011 | Booth, Jr. | H01L 21/845 257/306 |
| 2012/0146090 A1 * | 6/2012 | Lui | H01L 29/8613 257/139 |

OTHER PUBLICATIONS

W.R. Tonti, "eFuse Design and Reliability" (Oct. 2008).

* cited by examiner

STRUCTURE AND METHOD TO FORM PASSIVE DEVICES IN ETSOI PROCESS FLOW

CROSS-REFERENCE TO RELATED APPLICATIONS

This application is a divisional of U.S. application Ser. No. 13/251,660 filed on Oct. 3, 2011, now U.S. Pat. No. 8,648,438, the contents of which are incorporated herein by reference as fully set forth herein.

FIELD OF THE INVENTION

The present invention relates to semiconductor device fabrication and more particularly, to techniques for fabricating passive devices in an extremely-thin silicon-on-insulator (ETSOI) wafer.

BACKGROUND OF THE INVENTION

Employing an extremely-thin-silicon-on-insulator (ETSOI) field effect transistor (FET) device configuration is advantageous since having such a thin channel material allows for better control over short channel effects. However, it is difficult to form passive devices, such as diodes, eFUSEs and resistors, in an ETSOI wafer due to the limited amount of silicon and topography issues.

For example, silicidation is often used in forming the passive devices in the wafer. With an extremely thin (e.g., less than 10 nanometers thick) silicon layer, it is very difficult to control the silicidation process and often the metal consumes all of the silicon, which is undesirable.

As another example, an eFUSE requires enough semiconductor material underneath and between the contacts to function properly. With an extremely thin (e.g., less than 10 nanometers thick) silicon layer, it is almost impossible to control the FUSE property, which is undesirable for autonomic chips.

Therefore, cost-effective techniques for integrating passive device fabrication with ETSOI technology would be desirable.

SUMMARY OF THE INVENTION

The present invention provides techniques for fabricating passive devices in an extremely-thin silicon-on-insulator (ETSOI) wafer. In one aspect of the invention, a method for fabricating one or more passive devices in an ETSOI wafer is provided. The method includes the following steps. The ETSOI wafer having a substrate and an ETSOI layer separated from the substrate by a buried oxide (BOX) is provided. The ETSOI layer is coated with a protective layer. At least one trench is formed that extends through the protective layer, the ETSOI layer and the BOX, and wherein a portion of the substrate is exposed within the trench. Spacers are formed lining sidewalls of the trench. Epitaxial silicon templated from the substrate is grown in the trench. The protective layer is removed from the ETSOI layer. The passive devices are formed in the epitaxial silicon.

In another aspect of the invention, a device is provided. The device includes an ETSOI layer separated from a substrate by a BOX; at least one trench extending through the ETSOI layer and the BOX filled with epitaxial silicon; spacers lining sidewalls of the trench; and one or more passive devices formed in the epitaxial silicon.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for fabricating passive devices in an extremely-thin silicon-on-insulator (ETSOI) wafer. The present techniques address the above-described issues associated with ETSOI technology and passive device fabrication due to the limited amount of silicon and topography issues.

Figure 1:
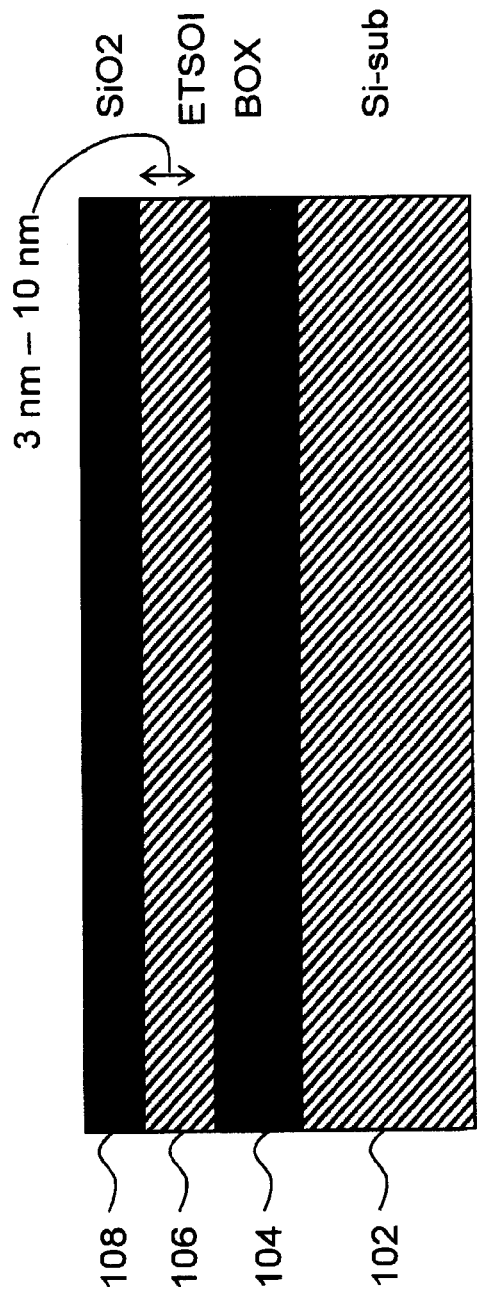
FIG. 1 is a cross-sectional diagram illustrating a protective layer having been coated on an extremely-thin silicon-on-insulator (ETSOI) wafer having an ETSOI layer separated from a substrate by a buried oxide (BOX) according to an embodiment of the present invention.

The starting structure for the fabrication process is an ETSOI wafer. As shown in FIG. 1, the ETSOI wafer includes a (e.g., silicon (Si) substrate) 102 and an ETSOI layer 106 separated from the substrate 102 by a buried oxide (BOX) 104. The BOX 104 may be composed of an oxide, such as silicon oxide, and may have a thickness ranging from 10 nm to 100 nm. In the case of an ETSOI wafer, the ETSOI layer 106 has a thickness of less than or equal to about 10 nanometers (nm), e.g., from about 3 nm to about 10 nm.

As shown in FIG. 1, a protective layer 108 is coated on the ETSOI wafer (i.e., on the ETSOI layer 106). Layer 108 serves to protect the ETSOI layer 106 during subsequent processing steps (e.g., during an epitaxial silicon-forming process, as described below).

A requirement for the protective layer 108 is that the protective layer 108 needs to be formed from a material that can be etched selective to electrical isolation barriers used later in the process to prevent cross talk between passive device and active device areas. By way of example only, silicon nitride and silicon oxide are materials with such etch selectivity. Thus, if the electrical isolation barriers are formed from silicon nitride, then the protective layer 108 may be formed from a silicon oxide, such as silicon dioxide ($SiO_2$). Conversely, if the electrical isolation barriers are formed from a silicon oxide, then the protective layer may be formed from silicon nitride. Silicon nitride and silicon oxide are being used herein merely as an example, and in practice any materials that exhibit an etch selectivity to one another may be employed.

According to an exemplary embodiment, protective layer 108 is formed from either silicon nitride or silicon oxide which is coated on the ETSOI wafer (on the ETSOI layer 106) using chemical vapor deposition (CVD) plasma-assisted CVD, metal-organic chemical vapor deposition (MOCVD), atomic layer deposition (ALD), evaporation, reactive sputtering, chemical solution deposition and other like deposition processes. The protective layer 108 may also be formed utilizing any combination of the above processes. The protective layer 108 is coated on the ETSOI layer 106 to a thickness suitable for hard masking or etch stopping during chemical mechanical polishing (CMP). By way of example only, a suitable thickness of the protective layer 108 is from about 3 nm to about 20 nm.

Next, the protective layer 108, the ETSOI layer 106 and the BOX 104 are recessed in one or more areas. According to an exemplary embodiment, the protective layer 108, the ETSOI layer and the BOX are recessed using a conventional lithography process. By way of example only, a suitable hardmask material can be blanket deposited over the wafer using, e.g., low-pressure chemical vapor deposition (LPCVD), to a thickness of from about 10 angstroms (Å) to about 50 (Å). Suitable hardmask materials include, but are not limited to, silicon nitride and silicon dioxide. The hardmask material can then be patterned using a standard photolithography process. An etch can then be performed through the patterned hardmask. According to an exemplary embodiment, a dry-etching process, such as reactive ion etching (RIE), is used for this recessing step. Further, a combination of RIE steps may be needed to complete the etch through the protective layer 108, the ETSOI layer 106 and the BOX 104. For instance, a first RIE step may be performed using a fluorine-containing, e.g., $CHF_3/CF_4$, or bromine chemistry, to etch through the protective layer 108 and the ETSOI layer 106. A second RIE step may then be performed using an oxygen-containing, e.g., $N_2/O_2$ chemistry to etch through the BOX 104. The result is a trench 202 that extends through the protective layer 108, the ETSOI layer 106 and the BOX 104. Following the formation of the trench 202, any remaining hardmask may be removed using RIE or a wet etch.

Figure 2:
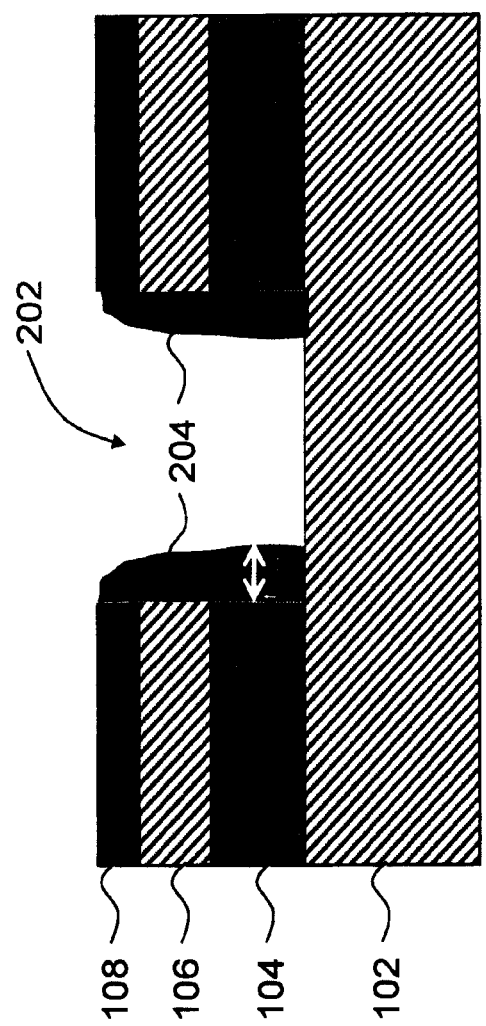
FIG. 2 is a cross-sectional diagram illustrating a trench having been formed in the protective layer, ETSOI layer and BOX and spacers having been formed in the trench wherein the spacers, if thick enough, can serve as an electrical isolation barrier separating active device and passive device areas of the wafer according to an embodiment of the present invention.

As shown in FIG. 2, a portion of the substrate 102 is exposed within the trench 202 (i.e., at the bottom of the trench 202). It is important that the trench 202 extend into the substrate 102 since this exposed portion of the substrate 102 will be used as a template for epitaxial silicon growth in the trench later in the process (see below).

As shown in FIG. 2, spacers 204 are then formed lining the sidewalls of trench 202. According to an exemplary embodiment, spacers 204 are formed from silicon nitride or silicon oxide. As will be apparent from the following description, the spacers will (if thick enough) serve as an electrical isolation barrier separating active device and passive device areas of the wafer, or alternatively the spacers will be thickened so as to suitably serve as the electrical isolation barrier by adding (the same) additional spacer material to the spacers. Thus the electrical isolation barrier will have the same composition (i.e., be formed from the same material) as spacers 204. As described above, silicon nitride and silicon oxide have good etch selectivity to one another. Thus, if the protective layer 108 is formed from either silicon nitride or silicon oxide, and the spacers 204/electrical isolation barrier are formed from the other of silicon nitride or silicon oxide vis-à-vis protective layer 108, then the protective layer 108 and the spacers 204/electrical isolation barrier will have good etch selectivity to one another. Using this exemplary configuration, protective layer 108 can be selectively removed using a wet etch, leaving the electrical isolation barrier intact. See below. What is important however is the etch selectivity between the protective layer 108 and the spacers 204/electrical isolation barrier. Thus the use of silicon nitride and silicon oxide is merely exemplary, and in practice the spacers 204 can be formed from any material with good etch selectivity given the composition of protective layer 108.

According to an exemplary embodiment, the spacers 204 are formed by first depositing the spacer material (e.g., silicon nitride or silicon dioxide) into the trench 202. The spacer material may be deposited into the trench 202 using CVD. A resist film is then deposited on the spacer material, masked and patterned with the spacer footprints. A nitride-selective or oxide-selective RIE (depending on the spacer material being employed) is then used to define the spacers 204 lining the sidewalls of the trench 202.

According to an exemplary embodiment, the spacers 204 are formed having a thickness $t_{spacers}$ (measured for example at the thickest portion of the spacer) of from about 3 nm to about 20 nm. See FIG. 2.

Epitaxial silicon 302 is then grown in the trench 202, filling the trench 202. See FIG. 3. The growth of epitaxial silicon 302 is templated from the exposed silicon of the substrate 102 at the bottom of trench 202. The silicon at the bottom of the trench is the only exposed silicon, since the protective layer 108 and the spacers 204 cover and protect the ETSOI layer 106.

According to an exemplary embodiment, the epitaxial silicon 302 is grown using a gaseous or liquid silicon precursor, as is known in the art. For instance, by way of example only, the epitaxial silicon 302 may be grown using vapor-phase epitaxy (VPE) with silane, dichlorosilane or trichlorosilane as source gases. Alternatively, molecular beam epitaxy (MBE) and/or liquid-phase epitaxy (LPE) as known in the art may be used.

The epitaxial silicon grown in this manner will likely overfill the trench 202 and extend out over the surface of protective layer 108. CMP can be used to planarize the epitaxial silicon 302 down to the surface of protective layer 108. The protective layer 108 can act as an etch stop for this CMP step. Accordingly, the protective layer 108 serves to protect the thin (see above) ETSOI layer 106 during the CMP.

According to an exemplary embodiment, the epitaxial silicon 302 will have a thickness of from about 400 Å to about 1,000 Å which provides an area of the wafer in which devices needing a thicker silicon can be formed. By comparison, the ETSOI layer 106 (having a thickness, e.g., of less than or equal to 10 nm (see above)) will provide an area of the wafer in which devices needing a thinner channel material can be formed.

Figure 3:
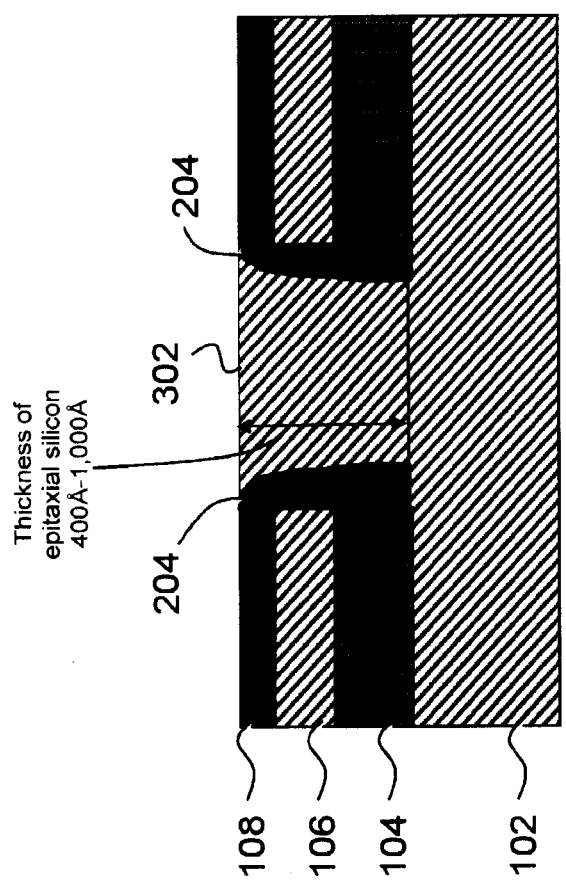
FIG. 3 is a cross-sectional diagram illustrating epitaxial silicon having been grown in the trench and polished down to a surface of the protective layer according to an embodiment of the present invention.

Spacers 204 are used to enable the epitaxial growth process illustrated in FIG. 3 that, as will be described in detail below, will be used to form an area(s) of the wafer in which one or more passive devices can be formed. Portions of the ETSOI layer 106 covered by the protective layer 108 will be used to form an area(s) of the wafer in which one or more active devices can be formed.

The 'passive device' area (also referred to as Area B in the following description) is separated from the 'active device' area(s) (also referred to as Area A in the following description) by an electrical isolation barrier (i.e., the electrical isolation barrier electrically isolates the ETSOI layer 106 from the epitaxial silicon 302). The electrical isolation barrier serves to prevent cross talk between the passive device and active device areas.

As highlighted above, if the spacers 204 are sufficiently thick, the spacers 204 may serve as the electrical isolation barrier between the passive device and active device areas of the wafer. Preferably, the electrical isolation barrier has a thickness of from about 5 nm to about 20 nm. Thus, when the thickness of the spacers (e.g., $t_{spacers}$ see FIG. 2) falls within that range, no further steps are needed to form an electrical isolation barrier as the spacers 204 already serve this function.

Figure 4:
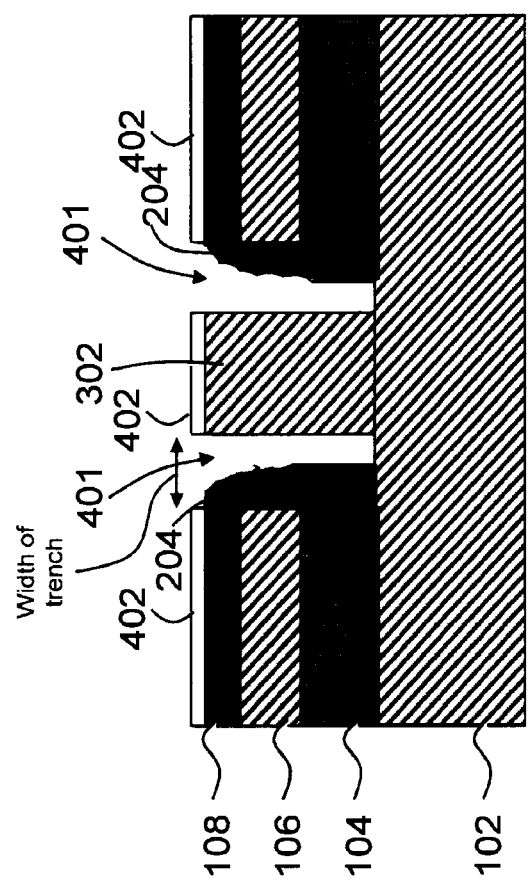
FIG. 4 is a cross-sectional diagram illustrating optional trenches having been formed in the epitaxial silicon adjacent to the spacers according to an embodiment of the present invention.

However, if the thickness of the spacers (e.g., $t_{spacers}$ see FIG. 2) is less than 5 nm, then it is preferable that additional steps be taken to 'thicken' the spacers (for example by adding additional spacer material) in order for the spacers to serve as a suitable electrical isolation barrier between the passive device and active device areas of the wafer. By way of example only, the spacers 204 can be thickened by first selectively etching epitaxial silicon 302 to form trenches 401 in epitaxial silicon 302 adjacent to spacers 204. This optional step is shown illustrated in FIG. 4.

Conventional lithography and etching processes may be employed to form the trenches 401. By way of example only, a hard mask material, such as silicon nitride or silicon dioxide, can be deposited on the wafer and patterned using a standard photolithography process to form patterned hardmask 402. An etch can then be performed through the patterned hardmask 402. According to an exemplary embodiment, a dry-etching process, such as RIE, is used for this step. The use of the hardmask 402 helps to regulate the dimensions of the trenches 401.

Since the purpose of the trenches 401 is to provide an area adjacent to the spacers in which to deposit additional spacer material (in order to thicken the spacers and thus form an electrical isolation barrier), then the total width of each of the trenches 401 should be equivalent to the final desired thickness of the electrical isolation barrier (e.g., from about 5 nm to about 20 nm, as provided above). The etch chemistry employed to from trenches 401 should be selective for the epitaxial silicon 302 leaving spacers 204 intact. By way of example only, a RIE step using a fluorine-containing, e.g., $CHF_3/CF_4$, or bromine chemistry, will provide this selectivity. After etching, any remaining hardmask 402 can be removed using RIE or a wet etching process.

Additional spacer material (e.g., silicon nitride or silicon dioxide, wherein the same material used to form spacers 204 is preferable) is then deposited into the trenches 401. This additional spacer material may be deposited using CVD. Any excess spacer material overfilling the trenches 401 can be removed using a process such as CMP.

Figure 5:
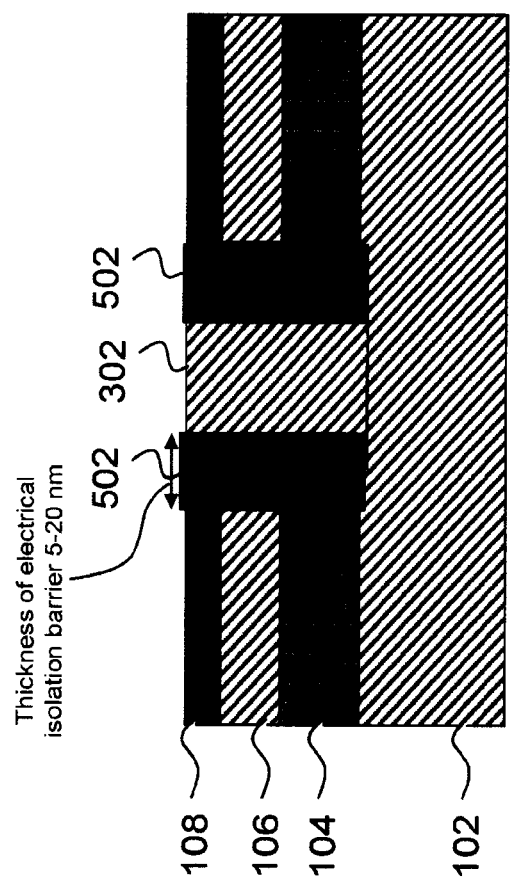
FIG. 5 is a cross-sectional diagram illustrating the optional trenches having been filled with additional spacer material to thicken the spacers and thereby form an electrical isolation barrier separating active device and passive device areas of the wafer according to an embodiment of the present invention.

The result is electrical isolation barriers 502. As shown in FIG. 5, electrical isolation barriers 502 have a thickness of from about 5 nm to about 20 nm. From this point on in the description, the exemplary embodiment wherein the spacers were thickened to form the electrical isolation barriers is used as an example both in the description and in the figures. However, as described above, if the spacers 204 are thick enough, no additional steps are needed to 'convert' them into the electrical isolation barriers 502, and the spacers 204 will serve as the electrical isolation barriers.

Thus, using this process, the spacers 204 are present during the epitaxial silicon growth. The electrical isolation barriers 502 are present to effectively create one or more isolation regions for the subsequent device formation. See below. For ease of depiction, only a single isolation region is shown. However it is to be understood that the techniques described herein can be used to form multiple thick silicon regions in which passive device of the circuit can be formed. Namely, the fabrication of passive devices, such as diodes, eFUSEs and resistors, commonly involves formation of metal silicide contacts. A sufficient silicon thickness is required for this process. By way of example only, eFUSEs can use a metal silicide that serves as a fuse link between an anode and a cathode.

A standard wet etch is then used to remove the protective layer 108 selective to the electrical isolation barriers 502. See FIG. 6, wherein the electrical isolation barriers 502 remain intact after removal of the protective layer 108. The particular wet etch process used depends on the particular composition of the protective layer and the electrical isolation barriers. By way of example only, in the case of a silicon oxide protective layer and silicon nitride electrical isolation barriers (see above), the wet etch consists of diluted hydrofluoric acid (DHF). Conversely, when the protective layer is formed from silicon nitride and the electrical isolation barriers are formed from silicon oxide, then a wet etch using a standard SC1 ($H_2O:H_2O_2:NH_4OH$ in volume ratio of from about 5:1:1 to about 7:2:1) for a length of time of from about two minutes to about five minutes at either room temperature or at a temperature of from about 50° C. to about 75° C. can be used to remove the protective layer while leaving the electrical isolation barriers intact.

Figure 6:
FIG. 6 is a cross-sectional diagram illustrating the protective layer having been removed selective to the electrical isolation barrier according to an embodiment of the present invention.

As shown in FIG. 6, the silicon in Area A is kept unchanged during the process flow. Logic and analog devices can be built in this area. By contrast, in Area B, the silicon volume is increased by the epitaxial growth. The larger silicon volume enables the building of passive devices without any issues related to silicon thickness.

Next, one or more active devices are formed in Area A (the ETSOI layer 106) and one or more passive devices are formed in Area B (the epitaxial silicon 302). See FIG. 7. For illustrative purposes, a single active device (in this case a transistor) is shown as having been formed in Area A and a single passive device is shown having been formed in Area B. As described in detail above, the electrical isolation barriers serve as an electrical isolation barrier between the ETSOI layer 106 and the epitaxial silicon 302.

Figure 7:
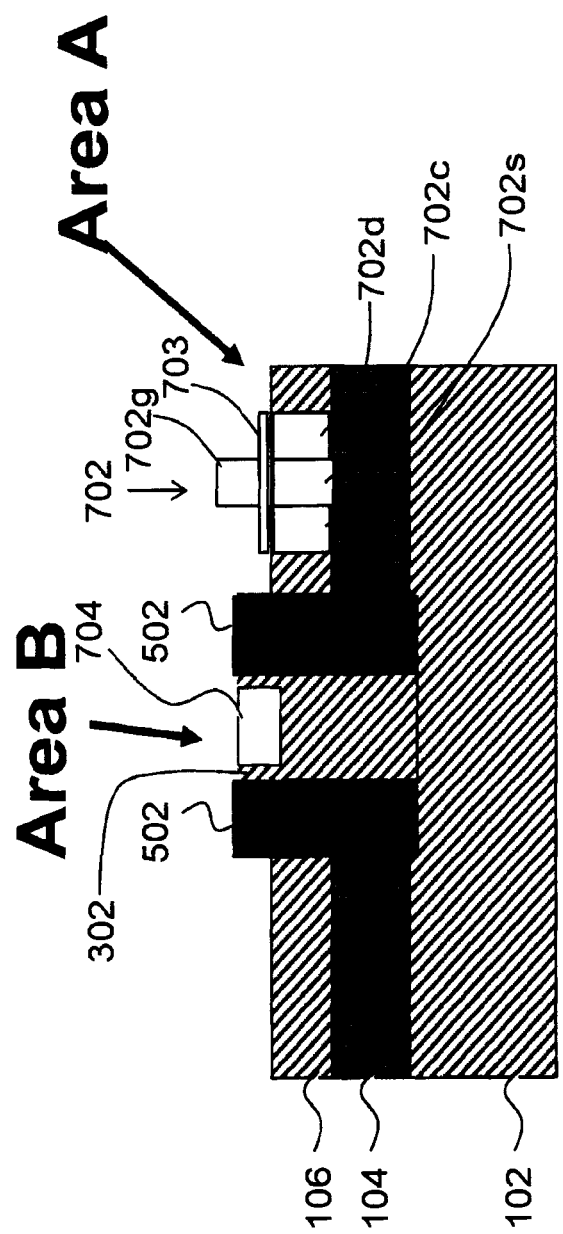
FIG. 7 is a cross-sectional diagram illustrating one or more active devices having been formed in the ETSOI layer and one or more passive devices having been formed in the epitaxial silicon according to an embodiment of the present invention.

It is notable that the particular active/passive device configurations for a given application and the processes for fabricating these devices on a wafer produced by way of the present teachings would be apparent to one of ordinary skill in the art. FIG. 7 thus merely provides an illustrative, non-limiting exemplary configuration.

According to the example shown in FIG. 7, an active device, i.e., a transistor 702, has been formed in Area A. Transistor 702 is representative of one or more logic and/or analog devices that can be formed in Area A. By way of example only, logic and/or analog devices represented by transistor 702 can include, but are not limited to, static random access memory (SRAM) devices, embedded dynamic random-access memory (eDRAM) devices and input/output (I/O) devices. One of ordinary skill in the art would know how such logic and analog devices would be formed and configured in this context.

Transistor 702 includes a source region 702s and a drain region 702d interconnected by a channel 702c. The source region 702s, drain region 702d and channel 702c are formed in the ETSOI layer 106, as is known in the art. A gate 702g which regulates electron flow through the channel 702c is separated from the channel 702c by a gate dielectric 703.

Gate dielectric 703 may be may be composed of an oxide material. Suitable examples of oxides that can be employed as the gate dielectric 703 include, but are not limited to: $SiO_2$, aluminum oxide ($Al_2O_3$), zirconium oxide ($ZrO_2$), hafnium oxide ($HfO_2$), tantalum oxide ($Ta_2O_5$), perovskite-type oxides and combinations and multi-layers thereof. The gate dielectric 703 may be composed of a high-k dielectric having a dielectric constant of greater than about 4.0, and in some embodiments greater than 7.0. The high-k dielectric may include, but is not limited to, an oxide, nitride, oxynitride and/or silicate including metal silicates and nitrided metal silicates. In one embodiment, the high-k dielectric is comprised of an oxide such as, for example, $HfO_2$, $ZrO_2$, $Al_2O_3$, titanium oxide ($TiO_2$), lanthanum oxide ($La_2O_3$), strontium titanate ($SrTiO_3$), lanthanum aluminate ($LaAlO_3$), yttrium oxide ($Y_2O_3$) and mixtures thereof. Other examples of high-k dielectrics suitable for use as the gate dielectric 703 in the present method include hafnium silicate and hafnium silicon.

The gate dielectric 703 can be formed by a thermal growth process such as, for example, oxidation, nitridation or oxynitridation. The gate dielectric 703 can also be formed by a deposition process such as, for example, chemical vapor deposition (CVD), plasma-assisted CVD, metal-organic chemical vapor deposition (MOCVD), atomic layer deposition (ALD), evaporation, reactive sputtering, chemical solution deposition and other like deposition processes. The gate dielectric 703 may also be formed utilizing any combination of the above processes. The gate dielectric 703 typically has a thickness ranging from 1 nm to 10 nm. In one example, the gate dielectric 703 has a thickness ranging from 2 nm to 5 nm.

The gate 702g may be formed from doped polysilicon and/or a metal or combination of suitable gate metals. Suitable gate metals include, but are not limited to, tungsten (W) and/or aluminum (Al) which may be deposited, for example, by CVD or ALD. The portion of the ETSOI layer 106 under the gate 702g will serve as the channel 702c.

Top-down implants with a doping agent may be used to form the source region 702s and the drain region 702d, as known in the art. Suitable doping agents include, but are not limited to boron and phosphorous. A silicide may be formed on the source region 702s and the drain region 702d. By way of example only, the silicide may be formed by first depositing a non-transition metal, such as nickel-platinum (NiPt) on source/drain regions, and then annealing to form the silicide.

A generic passive device 704 has been formed in Area B. Passive device 704 is representative of one or more passive devices, such as diodes, eFUSEs and resistors, that can be formed in Area B. The epitaxial silicon 302 in Area B provides the volume of material needed for forming the passive devices.

For example, a popular eFUSE structure needs a layer of silicon and a layer of silicide. The silicide will be heated and broken during programming. With ETSOI, it is almost impossible to form an eFUSE and bear good uniformity. Thus, a thick silicon (e.g., from about 400 Å to about 1,000 Å) is required to make eFUSEs with good uniformity.

One of ordinary skill in the art would know how to configure passive devices, such as eFUSEs, diodes and resistors, in the context of the present teachings. For example, eFUSEs are described, e.g., in W. R. Tonti, "eFuse Design and Reliability," in U.S. Patent Application Publication No. 20110002188, filed by Chen et al., entitled "Apparatus for Nonvolatile Multi-Programmable Electronic Fuse System" (hereinafter "Chen") and in U.S. Pat. No. 7,485,944 issued to Kothandaraman et al. entitled "Programmable Electronic Fuse" (see, for example, FIG. 1A), the contents of each of which are incorporated by reference herein.

For example, in Chen, an eFUSE structure includes a conductive metal silicide layer formed between a nitride overlayer and a polysilicon layer (which has a higher resistance than the metal silicide layer). Since conductivity of silicide is much higher than polysilicon, a majority of current will flow through the thin silicide layer during programming and cause it to break. Once that happens, the overall resistance will increase by an order of magnitude since polysilicon resistance is high.

Diodes are described, e.g., in U.S. Pat. No. 6,351,023 issued to Gates et al. entitled "Semiconductor Device Having Ultra-Sharp P-N Junction and Method of Manufacturing the Same" (hereinafter "Gates"), the contents of which are incorporated by reference herein. In Gates, diodes are described that include an N-type thin film semiconductor layer positioned on a metal addressing line, and a P-type semiconductor layer positioned over and in contact with the N-type layer. Resistors are described, e.g., in U.S. Pat. No. 3,729,662 issued to Langdon entitled "Semiconductor Resistor," the contents of which are incorporated by reference herein.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A device, comprising:
an extremely-thin silicon-on-insulator (ETSOI) layer separated from a substrate by a buried oxide (BOX);
at least one trench extending through the ETSOI layer and the BOX filled with epitaxial silicon which directly contacts the substrate and has a topmost surface extending above the ETSOI layer;
spacers lining sidewalls of the trench and an electrical isolation barrier layer formed on sidewalls of the epitaxial silicon that was exposed by the at least one trench and formed on an upper surface of the substrate and extending above the ETSOI layer; and
one or more passive devices formed in the epitaxial silicon,
wherein, in a horizontal plane, a topmost surface of the epitaxial silicon is coplanar with a topmost surface of the spacers in a horizontal orientation, and wherein the topmost surface of the epitaxial silicon and the topmost surface of the spacers extend above and are non-coplanar with a topmost surface of the ETSOI layer such that both the topmost surface of the epitaxial silicon and the topmost surface of the spacers are present above the topmost surface of the ETSOI layer.

2. The device of claim 1, wherein the ETSOI layer has a thickness of from about 3 nanometers to about 10 nanometers.

3. The device of claim 1, wherein the substrate is a silicon substrate.

4. The device of claim 1, wherein the spacers comprise silicon nitride or silicon oxide.

5. The device of claim 1, wherein each of the spacers serves as an electrical isolation barrier between the ETSOI layer and the epitaxial silicon.

6. The device of claim 5, wherein the electrical isolation barrier has a thickness of from about 5 nm to about 20 nm.

7. The device of claim 1, wherein the epitaxial silicon fills the trench.

8. The device of claim 1, wherein the passive devices comprise one or more of a diode, an eFUSE and a resistor.

9. The device of claim 1, further comprising:
one or more active devices formed in the ETSOI layer.

10. The device of claim 9, wherein the active devices comprise one or more of a logic device and an analog device.

11. The device of claim 1, wherein the topmost surface of the epitaxial silicon and the topmost surface of the spacers are coplanar with a topmost surface of the electrical isolation barrier layer.

12. The device of claim 1, wherein the sidewalls of the trench and the sidewalls of the epitaxial silicon are facing one another.

13. The device of claim 1, wherein the sidewalls of the trench and the sidewalls of the epitaxial silicon are both orthogonal to the topmost surface of the epitaxial silicon and the topmost surface of the spacers.

14. The device of claim 13, wherein the epitaxial silicon extends above the substrate.

15. The device of claim 14, wherein the ETSOI layer is segmented by the spacers, the electrical isolation barrier layer and the epitaxial silicon to form a plurality of isolated ETSOI structures, the isolated ETSOI structures contacting directly with the spacers.

16. The device of claim 15, further comprising an active device formed in the isolated ETSOI structure and including a source region and a drain region interconnected by a channel formed in the isolated ETSOI structure, and a gate separated from the channel by a gate dielectric.

17. The device of claim 16, wherein the active device is an embedded dynamic random-access memory (eDRAM) device.

18. The device of claim 17, wherein the gate dielectric is made of a material selected from $SiO_2$, aluminum oxide ($Al_2O_3$), zirconium oxide ($ZrO_2$), hafnium oxide ($HfO_2$), tantalum oxide ($Ta_2O_3$), perovskite-type oxides and combinations and multi-layers thereof.

19. The device of claim 17, wherein the gate dielectric is composed of a high-k dielectric with a dielectric constant greater than 7.0.

20. The device of claim 19, wherein the high-k dielectric is comprised of $HfO_2$, $ZrO_2$, $Al_2O_3$, titanium oxide ($TiO_2$), lanthanum oxide ($La_2O_3$), strontium titanate ($SrTiO_3$), lanthanum aluminate ($LaAlO_3$), yttrium oxide ($Y_2O_3$) and mixtures thereof.

* * * * *